(12) United States Patent
Miller

(10) Patent No.: US 6,438,252 B2
(45) Date of Patent: Aug. 20, 2002

(54) METHOD FOR ENCODING BITS IN A SIGNAL

(75) Inventor: Matthew L. Miller, Princeton, NJ (US)

(73) Assignee: Signafy, Inc., Princeton, NJ (US)

( * ) Notice: Subject to any disclaimer, the term of this patent is extended or adjusted under 35 U.S.C. 154(b) by 0 days.

(21) Appl. No.: 09/817,422

(22) Filed: Mar. 26, 2001

Related U.S. Application Data

(63) Continuation of application No. 09/105,495, filed on Jun. 26, 1998.

(51) Int. Cl.[7] .................. G06K 9/00; H04B 14/04; H04K 1/00; H04L 9/00

(52) U.S. Cl. .................. 382/100; 375/242; 380/28; 713/176

(58) Field of Search .................. 382/100, 245, 382/246, 247; 380/28; 375/241, 242, 253, 254, 353, 354; 713/176; 714/758, 784, 795

(56) References Cited

U.S. PATENT DOCUMENTS 5,909,645 A * 6/1999 Abramsky et al. ....... 455/249.1
6,118,826 A * 9/2000 Zehvi et al. ................ 375/261
6,199,191 B1 * 3/2001 Iwata ......................... 714/795

* cited by examiner

*Primary Examiner*—Amelia M. Au
*Assistant Examiner*—Mehrdad Dastouri
(74) *Attorney, Agent, or Firm*—Philip J. Feig

(57) ABSTRACT

A message in the form of a sequence of bits is encoded into relatively short, non-binary signals. The message (or vector) is divided into two halves. The encoder first determines an encoding of the message into a vector half the length of the eventual encoded vector. The half-length vector forms the first half of the encoded, and is negated to form the second half of the encoded vector. An identical synchronization signal is added to both halves of the encoded vector. The synchronization signal is used to compensate for the possibility that the received vector (or message) is cyclically rotated from the original vector. During decoding, the decoder first obtains the synchronization signal by adding the two halves of the vector together, canceling the encoded message. The synchronization signal is used to find the original cyclical shift of the vector. The decoder obtains the half-length encoded message vector by taking the difference between the two halves of the aligned full-length encoded vector. After decoding the vector into a bit sequence, the encoder re-encodes that bit sequence and compares the resulting vector with the original vector to determine whether the original vector truly encoded a message or was simply a noise signal.

30 Claims, 5 Drawing Sheets

METHOD FOR ENCODING BITS IN A SIGNAL

CROSS REFERENCE TO RELATED APPLICATIONS

This application is a continuation of prior application Ser. No. 09/105,495 filed Jun. 26, 1998.

FIELD OF THE INVENTION

The present invention relates to digital watermarking of data including image, video and multimedia data. Specifically, the invention relates to a method for encoding messages into relatively short, non-binary signals. It further relates to a method for decoding the messages from signals while simultaneously distinguishing signals that include encoded messages from signals that are simply noise. It is intended for application in storing information into media watermarks, but it also has application in other areas.

BACKGROUND OF THE INVENTION

U.S. patent application Ser. No. 08/534,894, filed Sep. 28, 1995, entitled "Secure Spread Spectrum Watermarking in Multimedia Data, now U.S. Pat. No. 5,930,369", and U.S. patent application Ser. No. 08/746,022, filed Nov. 5, 1996, entitled "Digital Watermarking, now U.S. Pat. No. 5,915,027", which are both incorporated herein by reference, describe methods of hiding and detecting relatively short, possibly non-binary vectors, or "watermarks", in various kinds of media, such as images, audio sequences, and video clips. Such methods are also described in article by Cox et al. entitled "Secure Spread Spectrum Watermarking for Images, Audio and Video" in Proc. IEEE Int. Conf. On Image Proc, ICIP '96, Lausanne, 1996, vol. III, pp. 243–246. The detection methods described in those inventions and in the Cox et al. article are capable of testing for the presence or absence of only one such hidden vector or watermark at a time. In applications where a given portion of media contains more than one hidden vector, each encoding a different message, the detector must sequentially test for each possible vector and identify the one that is most likely. This is feasible for small numbers of possible messages, but becomes too costly when the number of messages becomes large.

If the data hiding methods referred to above are to be used for messages of more than a small number of bits, such as 4, then methods must be devised for a) encoding bit sequences into vectors suitable for data hiding, b) decoding vectors that are extracted from portions of media, and c) determining whether such extracted vectors represent true hidden data or are merely noise signals. These problems are analogous to those found in transmitting data across noisy channels, where the vectors that are hidden in images are analogous to the modulated signals sent across the channels. Because of this analogy, the terms "vector" and "signal" will be used interchangeably.

Standard methods of transmitting binary messages across possibly noisy channels involve two basic steps at the transmitter. First, the message is encoded with an error-correction code. This increases the number of bits in the message, introducing a pattern of redundancy that can be exploited at the receiver to correct errors resulting from noise in the channel. Second, the expanded message is modulated into a signal with physical characteristics suitable for transmission over the channel, by, for example, modulating the amplitude of a carrier signal (AM), modulating the frequency of a carrier signal (FM), or spread-spectrum coding. While standard error-correction codes are directly suitable for the coding of messages for the watermarking methods referred to above, the standard methods of modulation are not so well suited. Since they encode bits sequentially, they have difficulty encoding more than a small number of bits into the relatively short vectors used in electronic watermarks. For example, consider coding 32 bits into a watermark vector of length 64. Each bit would be coded with only two samples, which is not enough to reliably carry information using AM, FM, or spread-spectrum techniques.

An alternative method of converting the error-correction-encoded bits into a vector suitable for a watermark is to treat each bit as a separate channel in a multi-channel communications system. In such a system, each channel is assigned a separate carrier or spread-spectrum signal, and the modulated messages for all the channels are added together into a single signal. At the receiver, separate correlations are performed for each of the channels, and the correlations are compared against a threshold, to obtain each of the transmitted messages in parallel.

The multi-channel approach can be applied to watermarking by assigning a separate "reference signal" to each bit. These reference signals are designed to have low correlation with one another. The watermark is constructed by either adding or subtracting each reference signal according to whether the corresponding bit is 1 or 0, respectively. Alternatively, the watermark might be constructed by either adding or not adding each reference signal according to whether the corresponding bit is 1 or 0, respectively. Watermarks are decoded by computing their correlations with the reference signals, and comparing the correlations with a pair of thresholds to determine whether the corresponding bits are 1 or 0. Approaches of this type have been applied to watermarking in, for example, the following publications: Swanson, et al., entitled "Robust Data Hiding for Images" in Proc. IEEE Digital Signal Processing Workshop, Loen, Norway, Sept., 1996; Hartung, et al., entitled "Digital Watermarking of Raw and Compressed Video" in Digital Compression Technologies and Systems for Video Communications, Oct. 1996; and Smith, et al., entitled "Modulation and Information Hiding in Images" in Proc. Int. Workshop on Information Hiding, May 1996.

A principal problem with these approaches is that they are limited to only one type of detection region for the possible watermarks. In the prior art, the region of watermark space that is decoded to a given bit sequence results in detection regions that are all planes, intersecting at right angles. Such a rectangular detection region is appropriate for many data transmission systems, but for some systems, other shapes of detection regions are desirable. This is particularly true of watermarking.

The present invention solves the problem of hiding messages of 8 or more bits into media. The invention provides a method of encoding a message, described as a sequence of a given number, B, of bits, into a vector suitable for hiding in media by means of the data hiding methods referred to above. This encoding method is a procedure by which one of $2^B$ possible vectors is generated. The invention further provides a method of decoding a given, possibly distorted, vector into the sequence of B bits that is most likely encoded by the bit sequence. Finally, the invention also provides a method for quickly deciding whether a given vector is one of the $2^B$ vectors that can be generated by the encoding process, or whether the vector is simply a noise signal. This last feature of the invention is important in deciding whether or not a given piece of media contains hidden information at all.

The detection regions (described below) employed in the detection of hidden data can be fairly arbitrary when practicing the present invention.

While the present invention solves the problem of hiding messages in media, it has application in other areas as well. In particular, the invention is suitable for use in any application where rectilinear detection regions are sub-optimal.

SUMMARY OF THE INVENTION

A primary object of the invention is a decoder which, after decoding a vector into a bit sequence, re-encodes that bit sequence and compares the resulting vector with the original vector to determine whether the original vector truly encoded a message or was simply a noise signal. A principal advantage of this approach is that it allows any type of comparison test to be performed, resulting in any shape of detection region. By proper design of the comparison test, an optimal detection region can be created.

A second object of the invention is a method of adding and using a synchronization signal to the encoded vector without disturbing the detectability of the encoded message. The synchronization signal is used to compensate for the possibility that the received vector is cyclically rotated from the original. The method splits the vector into two halves. During encoding, the encoder first determines an encoding of the message into a vector half the length of the eventual encoded vector. This half-length vector forms the first half of the encoded vector, and is negated to form the second half of the encoded vector. Then the encoder adds an identical synchronization signal to both halves of the encoded vector. During decoding, the decoder first obtains the synchronization signal by adding the two halves of the vector together, canceling the encoded message. The synchronization signal is used to find the original cyclical shift of the vector. Then the decoder obtains the half-length encoded message vector by taking the difference between the two halves of the aligned, full-length encoded vector.

Further objects of the invention will become more clearly apparent when the following description is read in conjunction with the accompanying drawing.

DETAILED DESCRIPTION OF THE INVENTION

Figure 1:
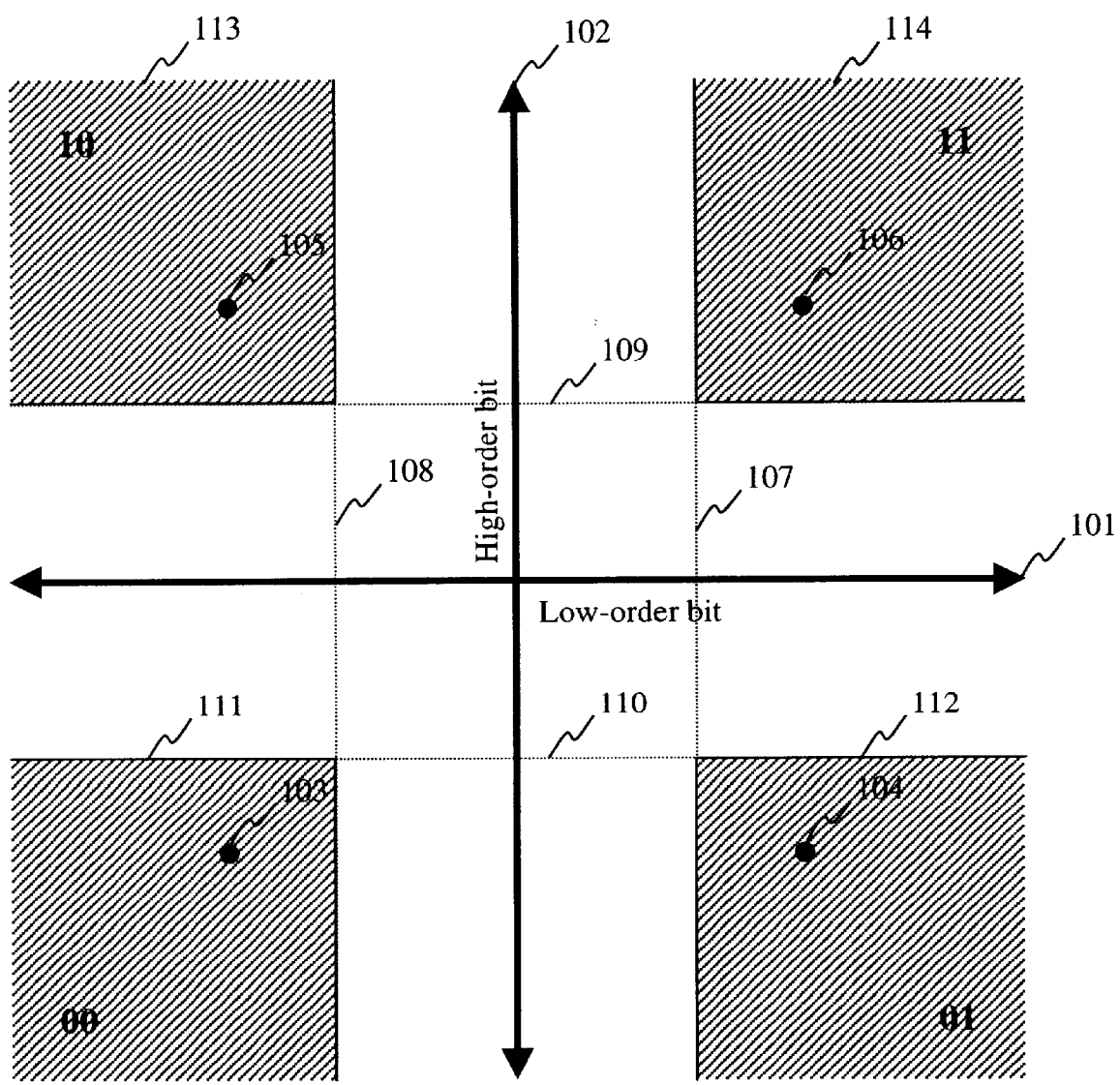
FIG. 1 shows detection regions for four possible two-bit messages that are created by prior-art methods of detecting signals.

Referring now to the figures and to FIG. 1 in particular, there is shown detection regions created by separate thresholding of the correlations between separate, orthogonal reference signals and a received signal, as is the case in many prior-art systems. The figure shows a slice of high-dimensional space in which every vector corresponds to a possible received signal. The X- and Y-axes (101,102) represent two orthogonal reference signals used to encode two bits. If it is assumed that the transmitter sends each bit using a predetermined amplitude of the reference signals, then it is possible to identify four possible combined signals that might be sent, depending on whether the message is 00, 01, 10, or 11. These four vectors are represented, respectively, by the four dots in the figure (103,104,105 and 106). The received vector is decoded by computing its correlation with each of the two reference signals. If the correlation with the low-order bit reference signal, i.e. the X axis 101, is above a threshold 107, then the low-order bit is 1. If it is below a threshold (108), then the low-order bit is 0. If it is between the thresholds 107 and 108, then the low-order bit cannot be determined and the received signal is assumed to be noise. Likewise, the correlation with the high-order bit reference signal, i.e. the Y-axis (102), is compared against two thresholds 109 and 110, to determine whether the high-order bit is 1, 0, or indeterminate. The resulting four detection regions are shown in gray (111,112, 113 and 114).

The detection regions of FIG. 1 are suitable for systems that satisfy two criteria: a) the dimensionality of the space is significantly larger than the number of bits in the messages, and b) the distribution of noise vectors that might be added to a watermark vector is rotationally symmetric around that vector. In such a system, the noise vectors are expected to be orthogonal to all the reference signals, so they will not change the correlations between the resulting, received signals and the reference signals. However, in watermarking with relatively short vectors, neither of these criteria applies. As a result, detection regions of different shapes are more suitable.

Figure 2:
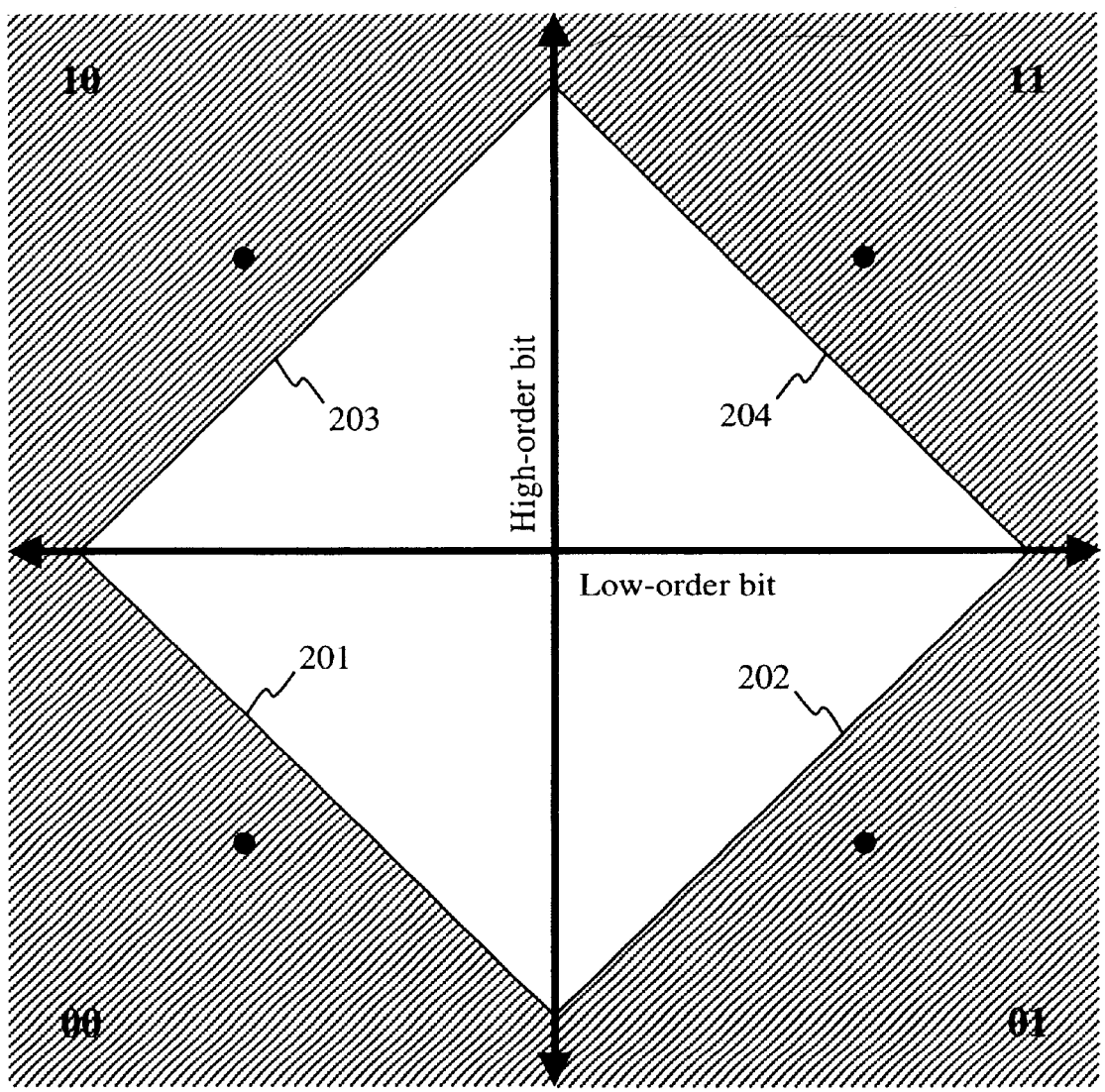
FIG. 2 shows set of detection regions that are more desirable than those of FIG. 1, and that are possible when using the present invention.

Consider, first, systems in which the number of bits is close to or equal to the dimensionality of the space (i.e. the number of elements in the watermark vector). In such cases, noise vectors cannot be expected to have low correlations with all the reference signals. This means that a given noise vector will be likely to change the correlation between the received vector and at least one of the reference signals, and the change in correlation will often be enough to cross the threshold for the corresponding bit. A preferable set of detection regions for such a system is shown in FIG. 2. Here, there is a separate detection threshold (201,202,203 and 204) for each of the four possible messages. A noise vector added to a given combined signal is likely to be orthogonal to that one combined signal, and, hence, unlikely to change the correlation between the received signal and the combined signal. Thus, it is unlikely to cross the threshold for that message.

Next, consider systems in which the distribution of noise vectors is not rotationally symmetric. The distribution of noise vectors applied to watermarks in images and other media can be highly asymmetric, and the best detection region to use for a single watermark is a hyperboloid. It follows that the best set of detection regions to use for a set of different possible watermarks is a set of different hyperboloids. Such detection regions are shown in FIG. 3.

Figure 3:
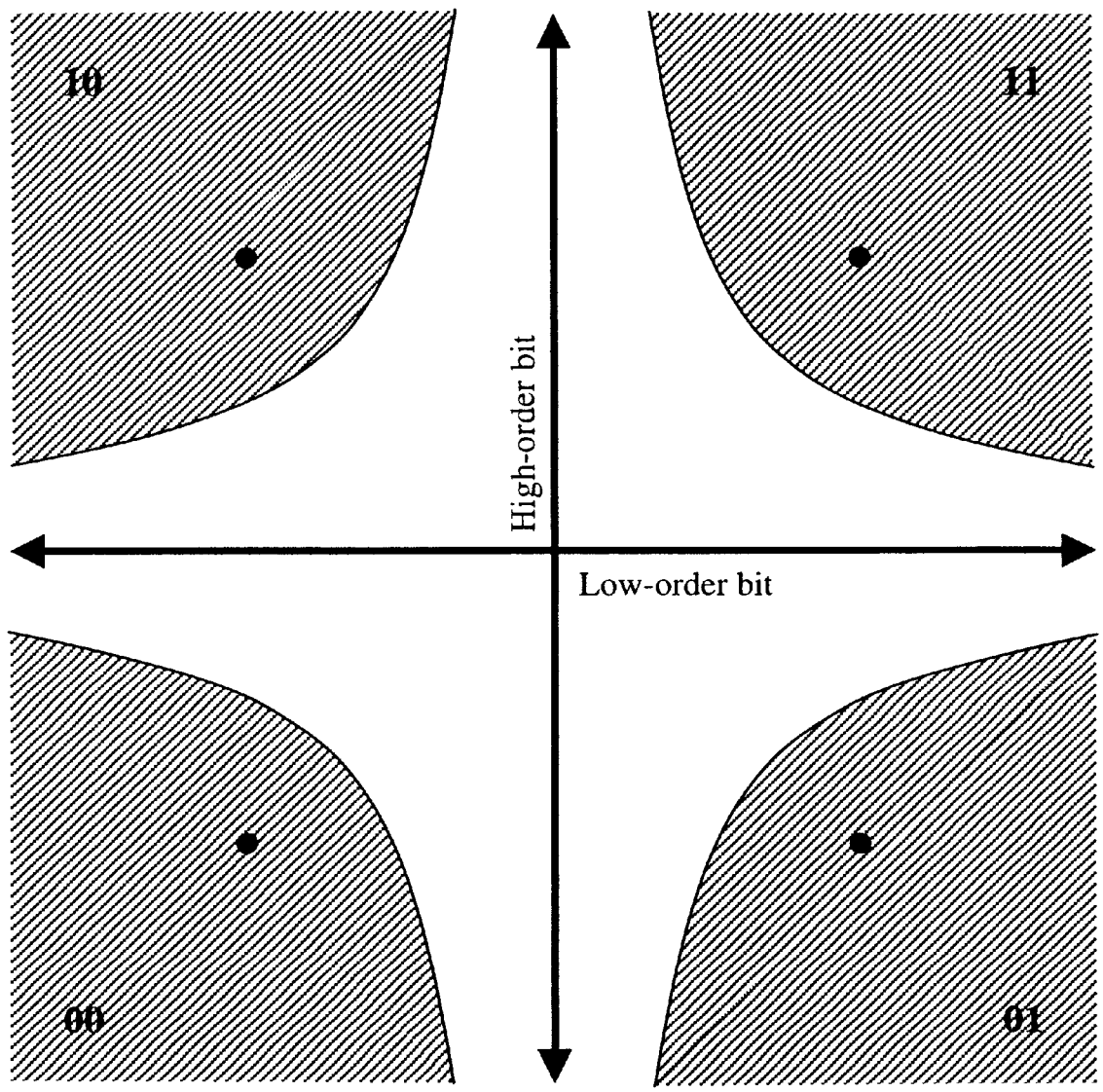
FIG. 3 shows an alternative set of detection regions that are more desirable than those of FIG. 1, and that are possible when using the present invention.

Using the present invention, it is possible to obtain the detection regions shown in FIGS. 2 and 3, as well as other detection regions not specifically described here.

Figure 4:
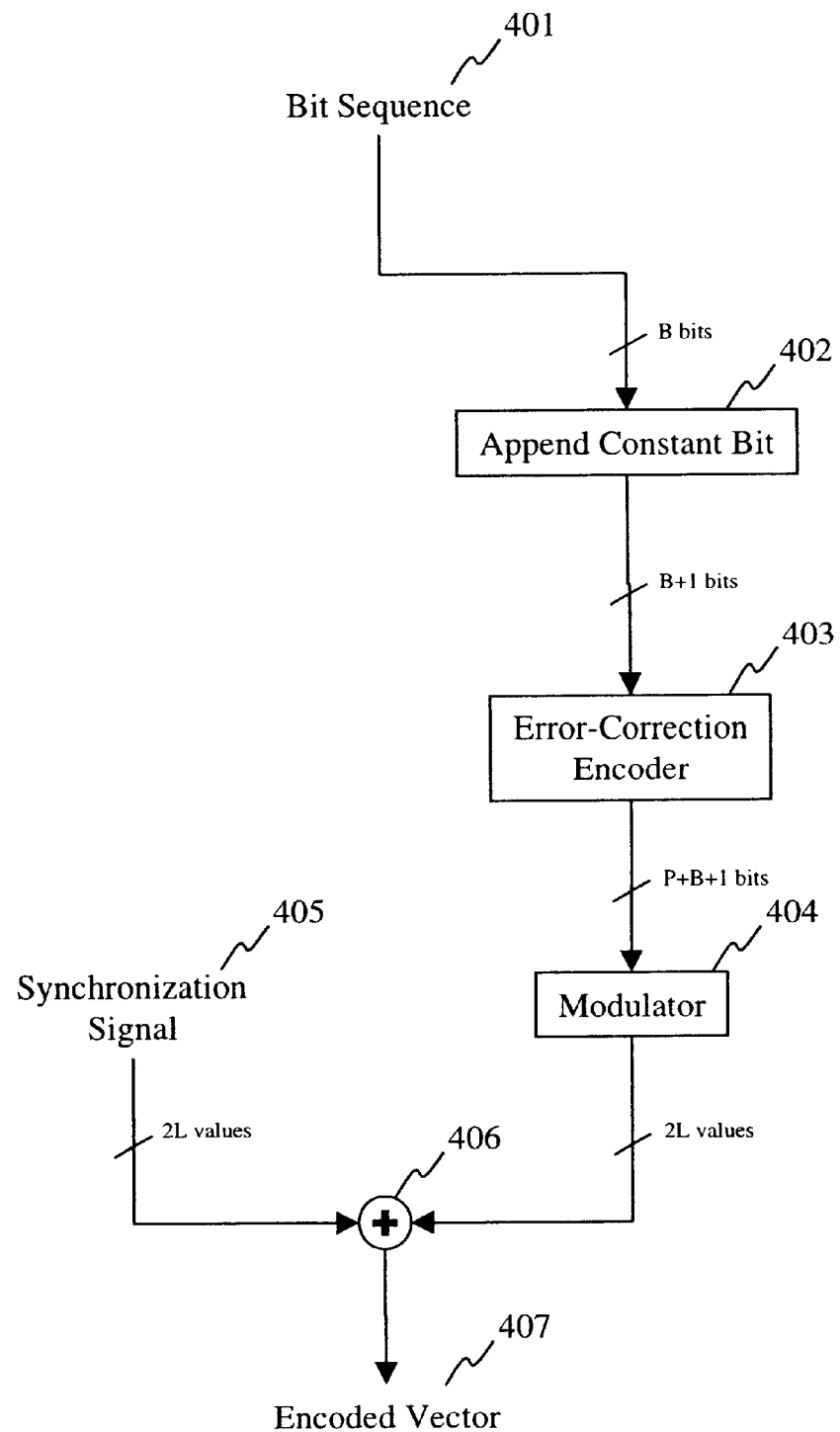
FIG. 4 is a data flow diagram for a preferred method of encoding a message into a signal according to the present invention.

FIG. 4 is a data flow diagram of a preferred method of encoding a message into a signal according to the present invention. A message comprising a given number, B, of bits is provided to the encoder 401. The first step is to append a constant bit to the message 402. This bit always has a constant value, for example 1, and will be used during decoding to correct for errors that might flip all of the bits. The resulting, B+1 bit message is expanded by means of an error-correction encoder 403, which adds a number, P, of redundant parity bits. In the preferred embodiment, this expansion is performed by a Hamming code, but other codes, such as BCH, Reed-Solomon, or Convolutional codes, can also be used. The P+B+1 bits that are output from the error-correcting encoder are then sent to modulator 404. The modulator constructs a vector V', of length 2L, by the following procedure:

1. Convert the P+B+1 bits into a column vector, D, of length P+B+1 in which each element is either a 1 or a −1 according to whether the corresponding bit is a 1 or a 0.
2. Multiply D by a "modulation matrix", M, of size L rows by P+B+1 columns, to obtain a length L column vector, V. The exact design of M is generally arbitrary, except that its columns should have low correlation with one another. In the preferred implementation, the columns of M are chosen to have zero correlation with one another.
3. Create a length 2L column vector, V', by appending the negation of V onto the end of V. That is $$V' = \begin{bmatrix} +V \\ -V \end{bmatrix}$$

Finally, a synchronization signal 405, is added 406 to V' to obtain the final, encoded vector 407. The synchronization signal 405 is a column vector, S', of the form $$S' = \begin{bmatrix} +S \\ +S \end{bmatrix}$$

where S is a column vector of length L that has good auto-correlation properties.

In alternative implementations, either one or both of the steps of appending a constant bit 402 and expanding the message by use of an error-correction encoder 403 may be eliminated. In such case, the length of the column vector, D, and the size of the modulation matrix, M, must be changed accordingly.

The output of the encoding process of FIG. 4 is an encoded vector that can be hidden in media using any of a variety of data hiding techniques. When the hidden data is to be detected, the data hiding technique first applies a procedure to extract a vector from the media. Then, rather than applying the test of the data hiding technique for the presence of a given watermark, the extracted vector is passed to the decoder of the present invention, as described below.

Figure 5:
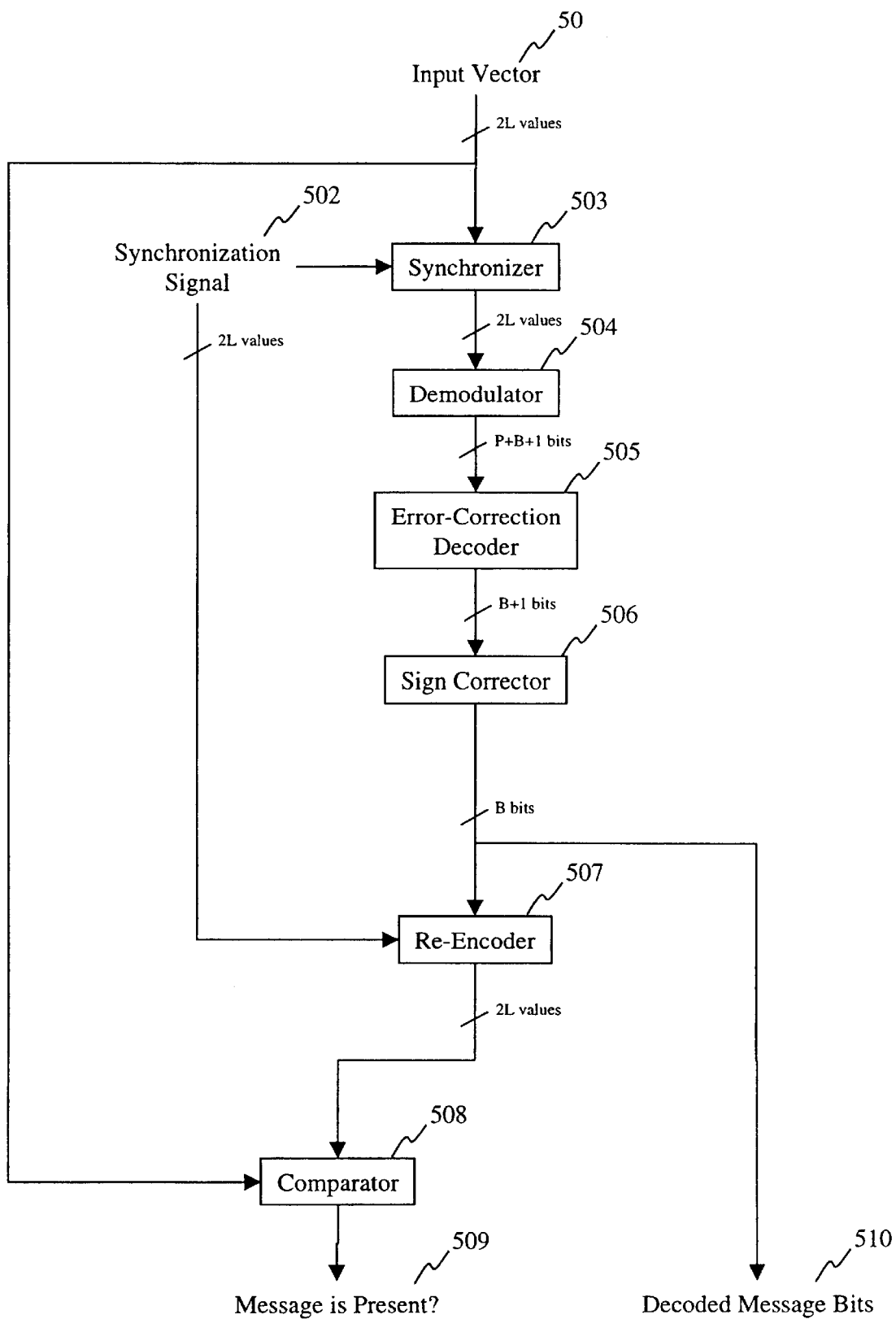
FIG. 5 is a data flow diagram for a preferred method of decoding a message according to the present invention.

FIG. 5 is a data flow diagram of a preferred method of decoding vectors according to the present invention. A vector, R, is provided to decoder 501. This vector might be an output of the above-described encoder plus some noise resulting from a data-hiding process and/or other degradations, or the vector might be purely random. The function of the decoder is to determine whether R contains an encoded message, and, if so, to decode that message into a sequence of bits. In the figure, the first sequence of steps 503,504,505 and 506 is concerned with identifying the most likely message that might have been encoded in R. The remaining steps 507 and 508 are concerned with determining whether R actually contains that encoded message.

The first step in decoding the input vector is to align R with a synchronization signal 502. This is performed by the synchronizer 503. This step is required because the data hiding process that was used might result in extracted vectors that are cyclically shifted from their original, embedded form. Synchronization is performed by the following steps:

1. Assuming that R is an encoded message plus some noise, obtain a version of the half-length synchronization signal, S, by dividing R into two halves and averaging the halves together. Thus, we assume that $$R = S' + V' + N = \begin{bmatrix} S + V + N_0 \\ S - V + N_1 \end{bmatrix}$$

cyclically shifted by an unknown amount, where $N=[N_0^T, N_1^T]^T$ is a random noise vector. The vectors S' and V' are as defined above. By splitting R into two halves and averaging both halves, we obtain $$S_R = (S+V+N_0+S-V+N_1)/2 = (2S+N_0+N_1)/2 \cong S$$

cyclically shifted by an unknown amount.

2. Find the cyclical rotation of $S_R$ that has the highest correlation with S. Cyclically rotate R by the same amount to obtain the aligned version, $R_A$.

If R is an encoded message plus some noise, then the result of synchronization, $R_A$, is either aligned with the original, encoded message, or it is cyclically shifted by L. Thus, we have either $$R_A = \begin{bmatrix} S + V + N_0 \\ S - V + N_1 \end{bmatrix} \text{ or }$$

$$R_A = \begin{bmatrix} S - V + N_0 \\ S + V + N_1 \end{bmatrix}$$

The next step is to demodulate the synchronized signal (504) to obtain P+B+1 bits. Demodulation is performed by the following steps:

1. Obtain a version of the half-length modulated P+B+1 bits, V, by dividing $R_A$ into two halves and averaging the first half with the negation of the second half. Thus, if $R_A$ is an encoded message, we have either $$V_R = (S+V+N_0-S+V-N_1)/2 = (2V+N_0-N_1)/2 \cong V$$

or $$V_R = (S-V+N_0-S-V-N_1)/2 = (-2V+N_0-N_1)/2 \cong -V$$

depending on whether $R_A$ is cyclically shifted by L.

2. Multiply $V_R$ by the inverse of M and threshold the result on 0 to obtain P+B+1 bits. Thus, wherever the result of this multiplication is greater than 0, we assign 1 to the corresponding bit. Wherever it is less than 0, we assign 0 to the corresponding bit.

If $R_A$ is an encoded message plus some noise, then the results of demodulation will be a reconstruction of the original P+B+1 bits, with some possible errors. The noise might cause some number of bits to be flipped. The possible cyclical shift by L might cause all the bits to be flipped.

The P+B+1 demodulated bits are then sent as input to the error-correction decoder 505. The decoder decodes the demodulated bits into B+1 bits. In the preferred embodiment, a Hamming decoder is used, but other error-correction decoders, such as BCH, Reed-Solomon or Convolutional decoders, might be used. However, if the encoder did not perform an error correction encoding step, then the error correction decoding step 505 is eliminated.

The final step in determining the most likely message encoded in R is to decide whether all the bits should be flipped to correct for the possibility that $R_A$ is cyclically shifted by L, which results in $R_A$ having the wrong sign. This step is performed by the sign corrector 506, which checks whether the constant bit added by the encoder was decoded as having the correct, constant value. For example, if the encoder always sets the constant bit to 1, but the bit has been decoded as 0, then all the bits must be flipped. The sign corrector 506 strips the constant bit after performing the correction. The output of the sign corrector 506 is the decoded message bits that are output from the decoder 510. However, if the encoder did not append a constant bit to the message, then the sign correction step 506 is eliminated.

To decide whether R contains an encoded message, the output of sign corrector 506 is sent to re-encoder 507. Re-encoder 507 reproduces the encoding process of FIG. 4 in its entirety. The output of the re-encoder is the vector that would be used to encode the bits that are most likely encoded in R. This vector is then sent to comparator 508, which compares the vector with R using a test that results in the desired shape of detection region. In the preferred embodiment, the test is the hyperbolic test shown in FIG. 3. However, a wide variety of other tests are possible, including, but not limited to, thresholding on correlation (as shown in FIG. 2), on normalized correlation, or on correlation coefficient. The output of the comparator 509 is one bit indicating whether or not the decoded message 510 should be considered a true message or just the result of a noise signal.

While there has been described and illustrated preferred methods of encoding messages into and decoding messages from signals, it will be apparent to those skilled in the art that variations and modifications are possible without deviating from the broad teachings and spirit of the present invention which shall be limited solely by the scope of the claims appended hereto.

What is claimed is:

1. A method of encoding a message in the form of a sequence of bits to form an encoded vector comprising the steps of:
    a) expanding the sequence of bits to obtain an expanded sequence of bits;
    b) modulating the expanded sequence of bits to obtain a modulated vector;
    c) appending the negation of the modulated vector to the modulated vector to obtain a double-length modulated vector, and
    d) adding a same synchronization signal to both the modulated vector and the negation of the modulated vector of the double-length modulated vector to obtain an encoded vector.

2. The method of claim 1, further comprising inserting the encoded vector into media as a watermark.

3. The method of claim 1, where said expanding comprises appending at least one redundant bit of constant value to the sequence of bits.

4. The method of claim 3, further comprising appending at least one additional redundant bit to the sequence of bits according to an error-correction encoding method.

5. The method of claim 4, further comprising inserting the encoded vector into media as a watermark.

6. The method of claim 4, where the error-correction encoding method is selected from the group consisting of Hamming encoding, BCH encoding, Reed-Solomon encoding, and Convolutional encoding.

7. The method of claim 1, where said expanding comprises appending at least one redundant bit to the sequence of bits according to an error-correction encoding method.

8. The method of claim 7, further comprising inserting the encoded vector into media as a watermark.

9. The method of claim 7, where the error-correction encoding method is selected from the group consisting of Hamming encoding, BCH encoding, Reed-Solomon encoding, or Convolutional encoding.

10. The method of claim 1, where said modulating comprises converting the expanded sequence of bits into a bit vector and multiplying the bit vector by a modulation matrix to obtain the modulated vector.

11. The method of claim 10, where the bit vector contains a first value corresponding to each 0 bit of the expanded sequence of bits and contains a second value corresponding to each 1 bit of the expanded sequence of bits.

12. The method of claim 10, where the columns of the modulation matrix have zero correlation with one another.

13. A method of decoding a received vector of two half vectors into a sequence of bits comprising the steps of:
    a) receiving a received vector of two half vectors, including a first half vector containing a synchronization signal and a first modulation vector, and a second half vector containing the synchronization signal and a second modulation vector which is the negation of the first modulation vector
    b) averaging the first half vector with the second half vector to obtain a received synchronization vector;
    c) determining an amount by which the received synchronization vector must be shifted to obtain the best match with a reference synchronization vector;
    d) shifting the received vector by the determined amount to obtain an aligned received vector, and
    e) demodulating the aligned received vector to obtain the sequence of bits.

14. The method of claim 13, where the determined amount is an amount of cyclical shifting.

15. The method of claim 13, where the match between the received synchronization vector and the reference synchronization vector is measured by computing the correlation between both synchronization vectors.

16. The method of claim 13, where said shifting the received vector is cyclical shifting.

17. The method of claim 13, where said demodulating comprises averaging a first half of the aligned received vector with the negation of a second half of the aligned received vector to obtain a received modulated vector; demodulating the received modulated vector to obtain an extended sequence of bits, including at least one redundant bit; and correcting errors in the extended sequence of bits using the at least one redundant bit in the extended sequence of bits to obtain the sequence of bits.

18. The method of claim 17, where said demodulating the received modulated vector comprises multiplying the received modulated vector by the inverse of a modulation matrix to obtain a demodulated vector and comparing each element of the demodulated vector with a predetermined threshold to determine whether the corresponding bit in the sequence of bits should be a 0 or a 1.

19. The method of claim 18, where the columns of the modulation matrix have zero correlation with one another.

20. The method of claim 18, where the predetermined threshold is zero.

21. The method of claim 17, where said correcting errors is performed according to an error-correction decoding method.

22. The method of claim 21, where the error-correction decoding method is selected from the group consisting of Hamming decoding, BCH decoding, Reed-Solomon decoding, and Convolutional decoding.

23. The method of claim 22, where said correcting errors comprises comparing one or more redundant bits with constant values to determine whether all of the bits must be flipped.

24. The method of claim 21, where said correcting errors comprises comparing one or more redundant bits with constant values to determine whether all the bits must be flipped.

25. The method of claim 17, where said correcting errors comprises comparing one or more redundant bits with constant values to determine whether all the bits must be flipped.

26. A method of encoding a message in the form of a sequence of bits to form an encoded vector comprising the steps of:
   a) modulating the sequence of bits to obtain a modulated vector;
   b) appending the negation of the modulated vector to the modulated vector to obtain a double-length modulated vector, and
   c) adding a synchronization signal to both the modulated vector and the negation of the modulated vector of the double-length modulated vector to obtain an encoded vector.

27. The method of claim 26, further comprising inserting the encoded vector into media as a watermark.

28. The method of claim 26, where said modulating comprises converting the sequence of bits into a bit vector and multiplying the bit vector by a modulation matrix to obtain the modulated vector.

29. The method of claim 28, where the bit vector contains a first value corresponding to each 0 bit of the expanded sequence of bitsand contains a second value corresponding to each 1 bit of the expanded sequence of bits.

30. The method of claim 28, where the columns of the modulation matrix have zero correlation with one another.

* * * * *